United States Patent
Sumitani et al.

(10) Patent No.: US 7,161,859 B2
(45) Date of Patent: Jan. 9, 2007

(54) SEMICONDUCTOR INTEGRATED CIRCUIT

(75) Inventors: Norihiko Sumitani, Osaka (JP); Masaya Sumita, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 73 days.

(21) Appl. No.: 11/114,165

(22) Filed: Apr. 26, 2005

(65) Prior Publication Data

US 2005/0265095 A1    Dec. 1, 2005

(30) Foreign Application Priority Data

May 31, 2004    (JP) ............................. 2004-161539

(51) Int. Cl.
*G11C 7/00*    (2006.01)
(52) U.S. Cl. ................. 365/203; 365/202; 365/189.08; 365/189.11
(58) Field of Classification Search ................. 365/203, 365/202, 207, 189.08, 189.11
See application file for complete search history.

(56) References Cited

U.S. PATENT DOCUMENTS 6,343,039 B1 *    1/2002    Agawa et al. ............. 365/203
6,501,687 B1 *    12/2002    Choi ...................... 365/189.11
6,608,786 B1    8/2003    Somasekhar et al.
2004/0264272 A1 *    12/2004    Demone ..................... 365/202

OTHER PUBLICATIONS

Agawa, K., et al. "A Bit-Line Leakage Compensation Scheme for Low-Voltage SRAM's," IEEE 2000 Symposium on VLSI Circuits, Digest of Technical Papers, pp. 70-71.

* cited by examiner

*Primary Examiner*—Richard Elms
*Assistant Examiner*—Toan Le
(74) *Attorney, Agent, or Firm*—McDermott Will & Emery LLP

(57) ABSTRACT

Voltage transfer switches and voltage input/output circuits are provided on a complementary bus line pair to be shared among a plurality of columns of a memory cell array. After a complementary bit line pair is precharged to a predetermined voltage, the voltage of uninverted bit line and the voltage of inverted bit line are exchanged before any of all memory cells belonging to the same column is selected by a word line. With this structure, a predetermined potential difference is ensured between the complementary bit line pair at the time of an activation of a sense amplifier even if the total sum of the off-leak currents of access transistors in all the memory cells belonging to the same column is almost as large as the ON-current (drive current) of a single drive transistor.

20 Claims, 14 Drawing Sheets

SEMICONDUCTOR INTEGRATED CIRCUIT

CROSS-REFERENCE TO RELATED APPLICATION

This application claims priority under 35 U.S.C. §119(a) on Japanese Patent Application No. 2004-161539 filed on May 31, 2004, the entire contents of the specification, drawings and claims of which are hereby incorporated by reference.

BACKGROUND OF THE INVENTION

The present invention relates to a semiconductor integrated circuit and specifically to a circuit technique for preventing a malfunction caused due to an off-leak current of a transistor.

SRAM (static random access memory) has been known as a conventional semiconductor integrated circuit. An SRAM includes numerous memory cells. Each memory cell includes, for example, first and second access transistors (N-channel MOS transistors), first and second drive transistors (N-channel MOS transistors), and first and second load transistors (P-channel MOS transistors). The drain of the first drive transistor is connected to one of a pair of bit lines through the first access transistor. The drain of the second drive transistor is connected to the other one of the pair of bit lines through the second access transistor. Each bit line is precharged to a predetermined voltage before read/write cycles.

In recent years, the threshold voltage of the transistor has been decreasing along with the advancement of miniaturization of the semiconductor process. As a result, the influence of the off-leak currents of the access transistors in the SRAM has been significantly increasing. If the total sum of off-leak currents of access transistors of a plurality of memory cells included in the same column (bit line leak current) is increased to be equivalent to an ON-current (drive current) flowing in a drive transistor in a single memory cell which is selected in a read operation in the same column, a desired potential difference cannot be secured between the bit line pair. As a result, there is a possibility that a malfunction occurs in a memory read operation. Further, the off-leak currents of the access transistors change depending on the cell data, temperature, or the like.

In order to solve this problem, K. Agawa et al., "A Bit-Line Leakage Compensation Scheme for Low-Voltage SRAM's", IEEE 2000 Symposium on VLSI Circuits, Digest of Technical Papers, pp. 70–71, discloses a technique wherein the magnitude of the leak current is detected for each bit line in a precharge period of a bit line pair, and in read/write cycles, a compensation current which has the same magnitude as that of the detected bit line leak current is injected to each bit line. However, this conventional technique causes an increase in power consumption due to injection of the compensation current into the bit lines.

SUMMARY OF THE INVENTION

An objective of the present invention is to provide a semiconductor integrated circuit including two signal lines and a plurality of transistors, the drains of which are connected to one of the signal lines, wherein the influence of off-leak currents of the transistors is alleviated without causing an increase in power consumption.

In order to achieve this objective, according to the present invention, the precharge voltage is adjusted in advance of an actual operation of the transistors, whereby leak compensation is attained.

Specifically, a semiconductor integrated circuit of the present invention comprises: first and second signal lines; a plurality of transistors, each of which has a drain connected to the first signal line; a precharge circuit for precharging the first and second signal lines to a first voltage; voltage adjustment means for adjusting, when the voltage of the first signal line changes to a second voltage due to off-leak currents of the plurality of transistors after completion of the precharge, the voltage of the second signal line to the second voltage before an actual operation of any of the plurality of transistors; and a differential amplification circuit for amplifying a potential difference between the first and second signal lines at the time of an actual operation of any of the plurality of transistors.

With the above structure, the precharge voltage of the second signal line is adjusted according to a variation in voltage of the first signal line due to leakage. Thus, leak compensation is attained even if off-leak currents of transistors change depending on the temperature, or the like.

DESCRIPTION OF THE PREFERRED EMBODIMENTS

Hereinafter, semiconductor memories, which are embodiments of a semiconductor integrated circuit of the present invention, are described with reference to the drawings. It should be noted that a large part of the description of the circuit as to data writing is omitted.

Figure 1:
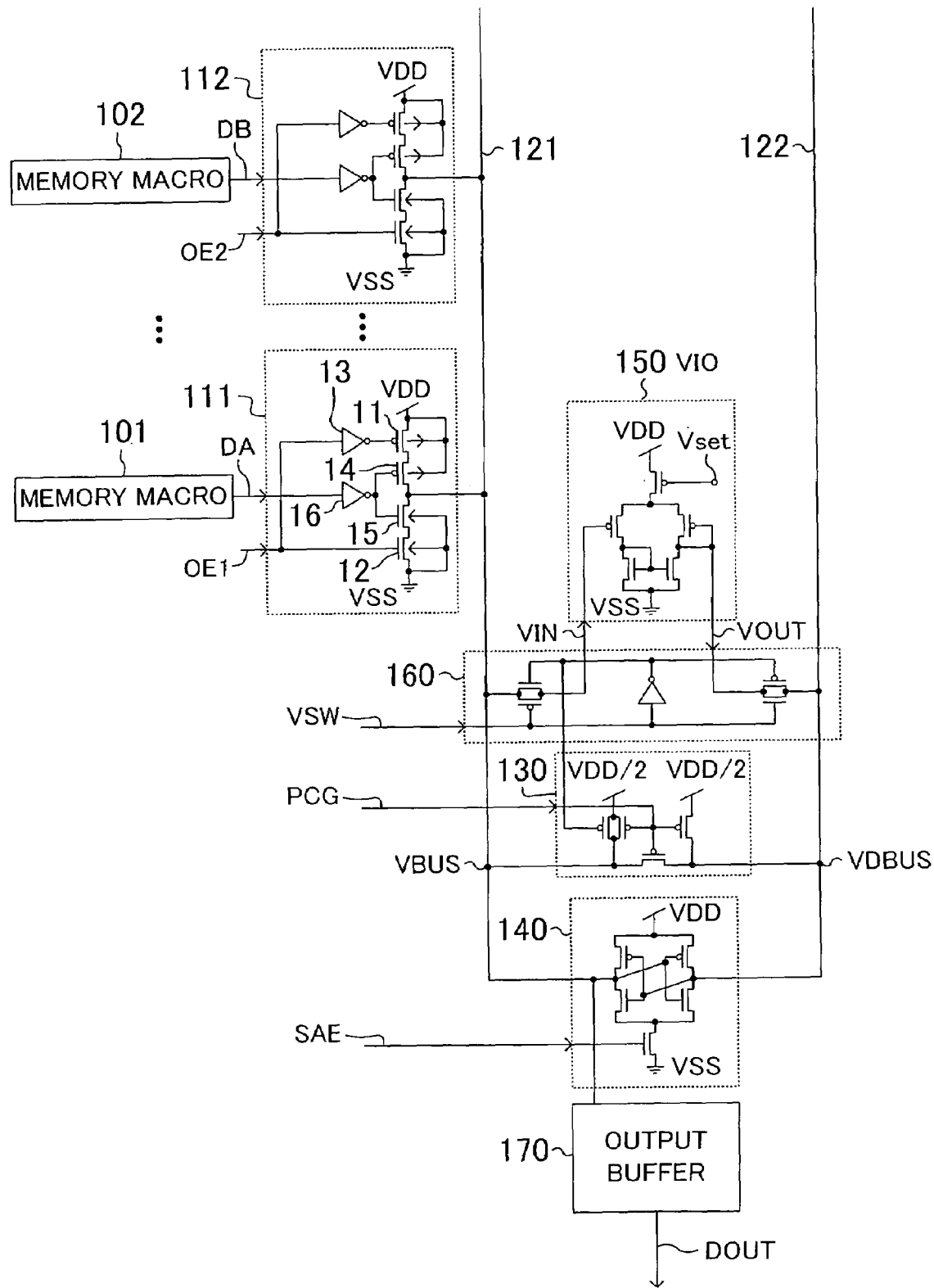
FIG. 1 is a circuit diagram showing a structure of a semiconductor integrated circuit according to the first embodiment of the present invention.

FIG. 1 shows a structure of a semiconductor integrated circuit according to the first embodiment of the present invention. It is assumed herein that a large number of tri-state buffers are connected to a bus line which is a common signal line.

Although the semiconductor integrated circuit of FIG. 1 includes a large number of memory macros, only two of the macros, memory macros 101 and 102, are shown for simplicity of illustration. The first memory macro 101 is connected to a common bus line 121 through a first tri-state buffer 111. The second memory macro 102 is connected to the common bus line 121 through a second tri-state buffer 112. VDD is the supply voltage, and VSS is the ground voltage.

The first tri-state buffer 111 includes a P-channel MOS drive transistor 11, an N-channel MOS drive transistor 12, inverter circuits 13 and 16, a P-channel MOS switching transistor 14 and an N-channel MOS switching transistor 15. The gate of the N-channel MOS drive transistor 12 is supplied with first output enable signal OE1. The gate of the P-channel MOS drive transistor 11 is supplied with an inverted signal of first output enable signal OE1. The gates of the switching transistors 14 and 15 are supplied with an inverted signal of first data signal DA supplied from the first memory macro 101. The drain of the P-channel MOS drive transistor 11 is connected to the bus line 121 through the P-channel MOS switching transistor 14. The drain of the N-channel MOS drive transistor 12 is connected to the bus line 121 through the N-channel MOS switching transistor 15. The source of the P-channel MOS drive transistor 11 is connected to supply voltage VDD. The source of the N-channel MOS drive transistor 12 is connected to ground voltage VSS. Thus, when first output enable signal OE1 is at L-level, the output of the first tri-state buffer 111 exhibits a high impedance state. When first output enable signal OE1 is at H-level and first data signal DA is at H-level (DA=1), the P-channel MOS drive transistor 11 drives the bus line 121 to H-level. When first output enable signal OE1 is at H-level and first data signal DA is at L-level (DA=0), the N-channel MOS drive transistor 12 drives the bus line 121 to L-level.

All of the other tri-state buffers, including the second tri-state buffer 112, have the same internal structure as that of the first tri-state buffer 111. In FIG. 1, OE2 is a second output enable signal, and DB is a second data signal supplied from the second memory macro 102.

Reference numeral 122 denotes a dummy bus line. The dummy bus line 122 has a line capacitance substantially equal to that of the bus line 121. It should be noted that none of the tri-state buffers is connected to the dummy bus line 122.

The semiconductor integrated circuit of FIG. 1 further includes a precharge circuit 130, a sense amplifier 140, a voltage input/output circuit (VIO) 150, a voltage transfer switch 160 and an output buffer 170. In FIG. 1, VBUS is the voltage of the bus line 121, and VDBUS is the voltage of the dummy bus line 122.

When precharge signal PCG is at L-level, the precharge circuit 130 precharges the bus line 121 and the dummy bus line 122 to a voltage which is just an intermediate level between supply voltage VDD and ground voltage VSS (VDD/2). When switch control signal VSW is at H-level, the precharge circuit 130 precharges only the bus line 121 to intermediate level voltage VDD/2.

The voltage input/output circuit 150 takes in input voltage VIN and outputs voltage VOUT which is equal to input voltage VIN. Bias setting voltage Vset, which is slightly lower than supply voltage VDD, is supplied to the voltage input/output circuit 150.

When switch control signal VSW is at L-level, the voltage transfer switch 160 supplies voltage VBUS of the bus line 121 to the voltage input/output circuit 150 as input voltage VIN. Thereafter, when switch control signal VSW rises to H-level, the voltage transfer switch 160 supplies output voltage VOUT of the voltage input/output circuit 150 to the dummy bus line 122.

The sense amplifier 140 is a differential amplification circuit. When sense amplifier enable signal SAE is at H-level, the sense amplifier 140 drives the voltages of the bus line 121 and the dummy bus line 122 such that the higher one of the voltages is driven to supply voltage VDD and the lower one is driven to ground voltage VSS, thereby amplifying the potential difference between the bus line 121 and the dummy bus line 122.

The output buffer 170 outputs voltage VBUS of the bus line 121, which has been amplified by the sense amplifier 140, as data output signal DOUT.

Figure 2:
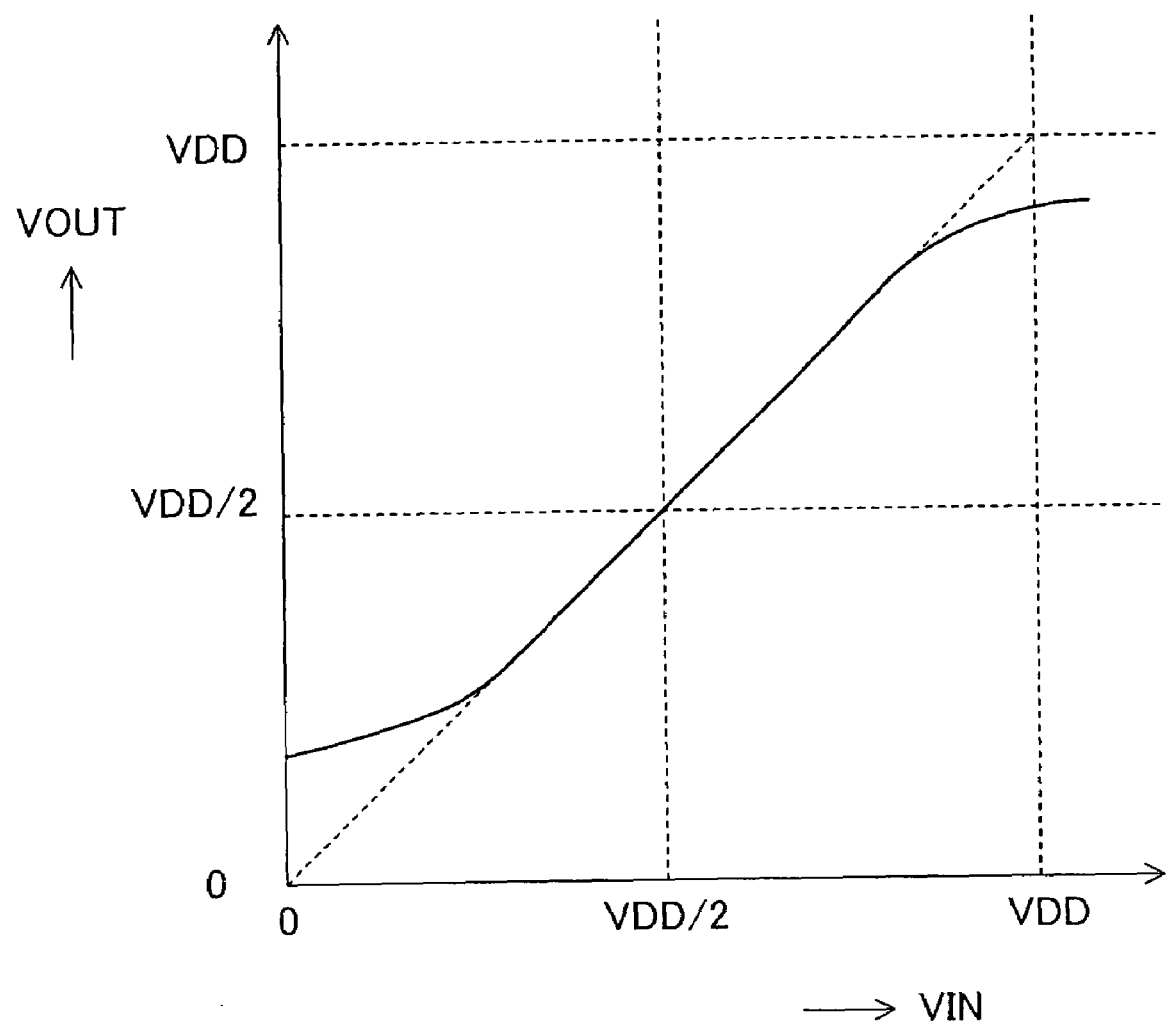
FIG. 2 shows the input/output characteristic of a voltage input/output circuit of FIG. 1.

FIG. 2 shows the input/output characteristic of the voltage input/output circuit 150 of FIG. 1. As illustrated by a solid line in FIG. 2, the input/output characteristic is linear when input voltage VIN has a value near intermediate level voltage VDD/2.

Figure 3:
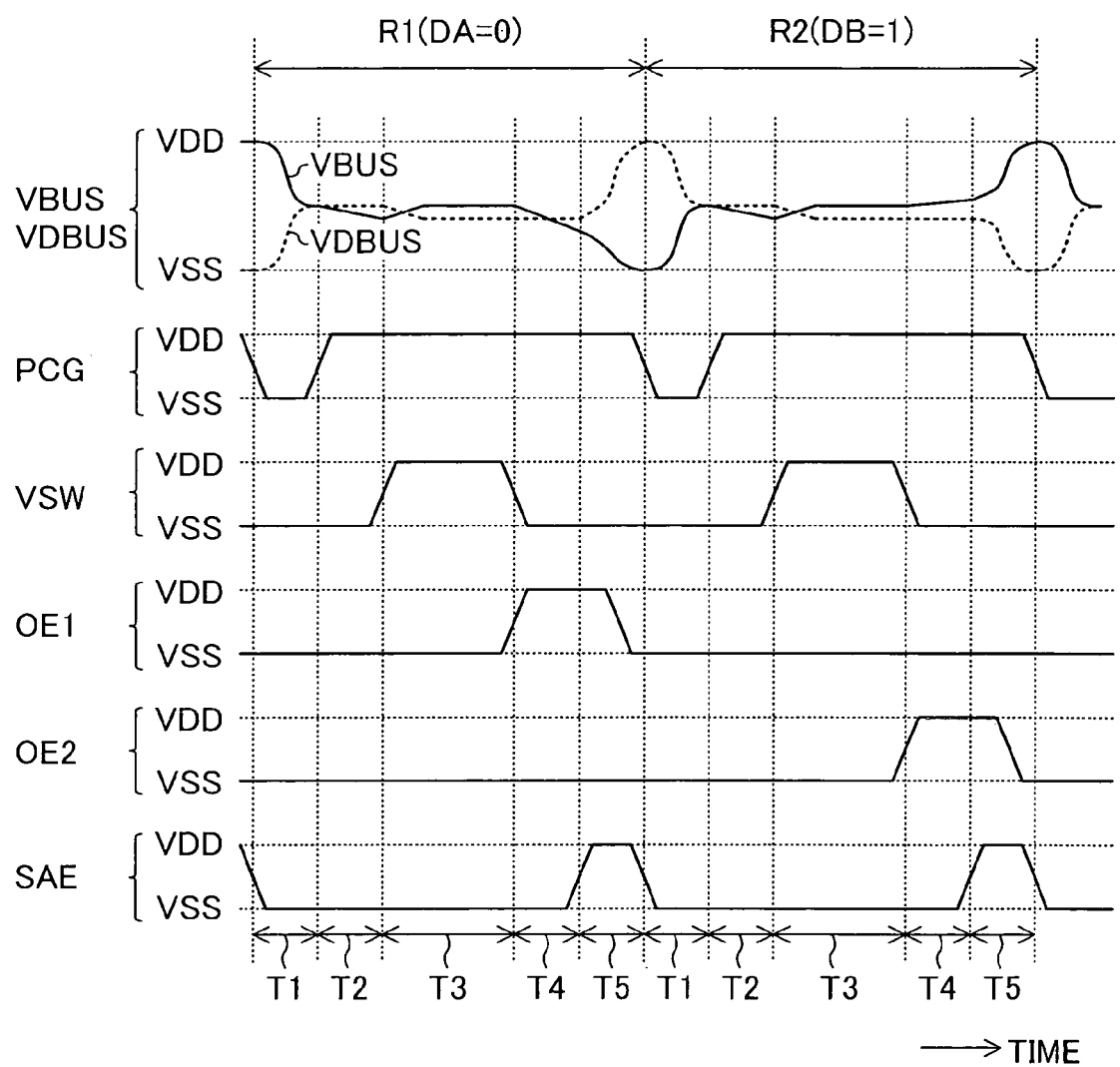
FIG. 3 is a timing chart showing exemplary signal waveforms in the semiconductor integrated circuit of FIG. 1.

FIG. 3 shows exemplary signal waveforms in the semiconductor integrated circuit of FIG. 1. In FIG. 3, R1 is the first read cycle, and R2 is the second read cycle. It is assumed herein that, in first read cycle R1, data of "0" (DA=0) is output from the first memory macro 101, and in second read cycle R2, data of "1" (DB=1) is output from the second memory macro 102. It is also assumed that, in all the tri-state buffers 111 and 112, the off-leak currents of the P-channel MOS drive transistors 11 are small, whereas the off-leak currents of the N-channel MOS drive transistors 12 are large.

In the first place, first read cycle R1 is described. Periods T1 to T3 are preparation periods, and periods T4 and T5 are actual read periods.

In period T1, precharge signal PCG is lowered to L-level while output enable signals OE1 and OE2 of all the tri-state buffers 111 and 112 are kept at L-level, and switch control signal VSW is kept at L-level. In the meantime, the precharge circuit 130 precharges both the bus line 121, which has been charged to supply voltage VDD, and the dummy bus line 122, which has been discharged to ground voltage VSS, to intermediate level voltage VDD/2.

In period T2, precharge signal PCG is restored to H-level, whereby the operation of the precharge circuit 130 is stopped. After the precharge is stopped, voltage VBUS of the bus line 121 gradually decreases because of the off-leak currents of the N-channel MOS drive transistors 12 in all the tri-state buffers 111 and 112. In the meantime, the voltage transfer switch 160 continues to supply voltage VBUS of the bus line 121 to the voltage input/output circuit 150 as input voltage VIN. On the other hand, voltage VDBUS of the dummy bus line 122 scarcely changes.

In period T3, switch control signal VSW is pulled up to H-level. In response to this, the voltage transfer switch 160 is switched from the input side to output side of the voltage input/output circuit 150, such that output voltage VOUT of the voltage input/output circuit 150 is supplied to the dummy bus line 122. In the meantime, the precharge circuit 130 receives an inverted signal of switch control signal VSW to again precharge only the former of the bus line 121 and the dummy bus line 122 to intermediate level voltage VDD/2. As a result, the relationship between voltage VBUS of the bus line 121 and voltage VDBUS of the dummy bus line 122 at the end of period T2 is inverted before the end of period T3. That is, the precharge voltage of the dummy bus line 122 is adjusted to a voltage in which the total sum of the off-leak currents of the N-channel MOS drive transistors 12 of all the tri-state buffers 111 and 112 which are in a high impedance output state is reflected.

In period T4, switch control signal VSW is restored to L-level, whereby the voltage transfer switch 160 is switched to the input side of the voltage input/output circuit 150, and the operation of the precharge circuit 130 is stopped. At the same time, first output enable signal OE1 is pulled to H-level, such that the first tri-state buffer 111 performs an active output operation according to data signal DA of the first memory macro 101. Because of "DA=0" as described above, the N-channel MOS switching transistor 15 in the first tri-state buffer 111 is turned on. Since output enable signal OE1 is at H-level, the N-channel MOS drive transistor 12 in the first tri-state buffer 111 is also on. Thus, the first tri-state buffer 111 performs the L-level output operation. Therefore, voltage VBUS of the bus line 121 is driven toward L-level by the N-channel MOS drive transistor 12 of the first tri-state buffer 111. On this occasion, the off-leak currents of the N-channel MOS drive transistors 12 of all the other tri-state buffers including the second tri-state buffer 112 help a rapid decrease of voltage VBUS of the bus line 121. Thus, at the end of period T4, voltage VBUS of the bus line 121 is lower than voltage VDBUS of the dummy bus line 122, and the potential difference between the bus line 121 and the dummy bus line 122 exceeds a difference necessary for the operation of the sense amplifier 140.

In period T5, sense amplifier enable signal SAE is pulled to H-level, whereby the sense amplifier 140 is activated. As a result, voltage VBUS of the bus line 121 is amplified to ground voltage VSS, and voltage VDBUS of the dummy bus line 122 is amplified to supply voltage VDD. Voltage VBUS of the bus line 121 which is obtained in period T5 is output as data output signal DOUT (=0) through the output buffer 170.

The operation during periods T1 to T3 of second read cycle R2 is the same as that of first read cycle R1. At the end of period T3, voltage VDBUS of the dummy bus line 122 is lower than voltage VBUS of the bus line 121.

In period T4 of second read cycle R2, second output enable signal OE2 is pulled to H-level, such that the second tri-state buffer 112 performs an active output operation according to data signal DB of the second memory macro 102. Because of "DB=1" as described above, the P-channel MOS switching transistor 14 in the second tri-state buffer 112 is turned on. Since output enable signal OE2 is at H-level, the P-channel MOS drive transistor 11 in the second tri-state buffer 112 is also on. Thus, the second tri-state buffer 112 performs the H-level output operation. Therefore, voltage VBUS of the bus line 121 is driven toward H-level by the P-channel MOS drive transistor 11. On this occasion, even if the total sum of the off-leak currents of the N-channel MOS drive transistors 12 in all the tri-state buffers 111 and 112 is almost as large as the ON-current (drive current) of the P-channel MOS drive transistor 11 in the second tri-state buffer 112, occurrence of a predetermined potential difference between the bus line 121 and the dummy bus line 122 at the start of next period T5 is ensured because voltage VDBUS of the dummy bus line 122 has been lowered in advance in period T3.

In next period T5, sense amplifier enable signal SAE is pulled to H-level, whereby the sense amplifier 140 is activated. As a result, voltage VBUS of the bus line 121 is amplified to supply voltage VDD, and voltage VDBUS of the dummy bus line 122 is amplified to ground voltage VSS. Voltage VBUS of the bus line 121 which is obtained in period T5 is output as data output signal DOUT (=1) through the output buffer 170.

The length of time from a halt of re-precharging by pulling down switch control signal VSW to activation of the sense amplifier 140 (period T4) is preferably set to equal the length of time in which a variation in voltage of the bus line 121 due to the off-leak currents of the N-channel MOS drive transistors 12 in all the tri-state buffers 111 and 112 before the voltage adjustment of the dummy bus line 122 is allowed (period T2).

Figure 4:
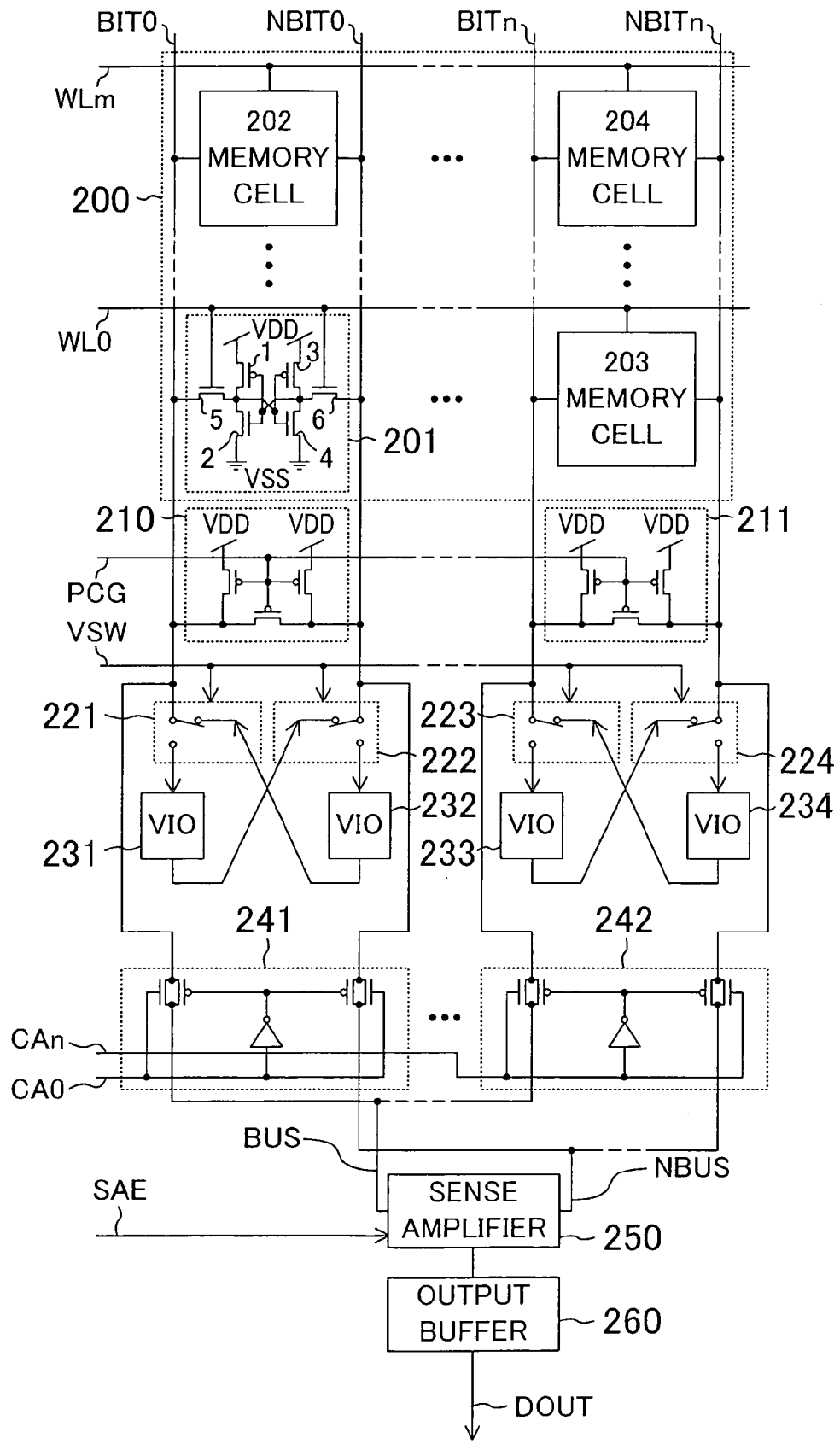
FIG. 4 is a circuit diagram showing a structure of a semiconductor integrated circuit according to the second embodiment of the present invention.

FIG. 4 shows a structure of a semiconductor integrated circuit according to the second embodiment of the present invention. The semiconductor integrated circuit of FIG. 4 has an SRAM memory cell array 200 including m+1 rows and n+1 columns where m and n are integers equal to or greater than 1. It should be noted that, for simplicity of illustration, only four memory cells 201, 202, 203 and 204, each having the above-described 6-transistor structure, are shown. The first and second memory cells 201 and 202 are connected to complementary bit line pair BIT0 and NBIT0 of column 0. The third and fourth memory cells 203 and 204 are connected to complementary bit line pair BITn and NBITn of column n. The first and third memory cells 201 and 203 are connected to the word line WL0 of row 0. The second and fourth memory cells 202 and 204 are connected to the word line WLm of row m. VDD is the supply voltage, and VSS is the ground voltage. In the following description, BIT0 is referred to as "uninverted bit line" and NBIT0 is referred to as "inverted bit line" as necessary.

Bus lines BUS and NBUS shown in FIG. 4 constitute a complementary bus line pair which is shared among a plurality of columns. In the following description, BUS is referred to as "uninverted bus line" and NBUS is referred to as "inverted bus line" as necessary.

The first memory cell 201 includes a first P-channel MOS load transistor 1, a first N-channel MOS drive transistor 2, a second P-channel MOS load transistor 3, a second N-channel MOS drive transistor 4, a first N-channel MOS access transistor 5 and a second N-channel MOS access transistor 6. The drain of the first N-channel MOS drive transistor 2 is connected to the uninverted bit line BIT0 through the first N-channel MOS access transistor 5. The drain of the second N-channel MOS drive transistor 4 is connected to the inverted bit line NBIT0 through the second N-channel MOS access transistor 6. The gates of the first and second N-channel MOS access transistors 5 and 6 are connected to the word line WL0 of row 0. Thus, when the word line WL0 is at L-level, the first memory cell 201 exhibits a high impedance state with respect to the complementary bit line pair BIT0 and NBIT0. When the word line WL0 is at H-level and the cell data is "0", the first N-channel MOS drive transistor 2 drives the uninverted bit line BIT0 to L-level. When the word line WL0 is at H-level and the cell data is "1", the second N-channel MOS drive transistor 4 drives the inverted bit line NBIT0 to L-level.

The other memory cells, including the second, third and fourth memory cells 202, 203 and 204, have the same internal structure as that of the first memory cell 201.

Referring to FIG. 4, a precharge circuit 210, first and second voltage transfer switches 221 and 222, first and second voltage input/output circuits (VIO) 231 and 232, and a column switch 241 belong to column 0.

When precharge signal PCG is at L-level, the precharge circuit 210 precharges the complementary bit line pair BIT0 and NBIT0 to a voltage equal to supply voltage VDD.

The first and second voltage input/output circuits (VIO) 231 and 232 have substantially the same circuit structure as that of the voltage input/output circuit 150 shown in FIG. 1 except that the first and second voltage input/output circuit (VIO) 231 and 232 of FIG. 4 are supplied with supply voltage VDD2 (not shown) which is higher than supply voltage VDD, and a voltage slightly lower than VDD2 is also supplied as a bias setting voltage.

When switch control signal VSW is at L-level, the first voltage transfer switch 221 supplies the voltage of the uninverted bit line BIT0 to the first voltage input/output circuit 231 as an input voltage. Thereafter, when switch control signal VSW rises to H-level, the first voltage transfer switch 221 supplies the output voltage of the second voltage input/output circuit 232 to the uninverted bit line BIT0.

When switch control signal VSW is at L-level, the second voltage transfer switch 222 supplies the voltage of the inverted bit line NBIT0 to the second voltage input/output circuit 232 as an input voltage. Thereafter, when switch control signal VSW is at H-level, the second voltage transfer switch 222 supplies the output voltage of the first voltage input/output circuit 231 to the inverted bit line NBIT0.

When column selection signal CA0 of column 0 is at H-level, the column switch 241 connects the uninverted bit line BIT0 and the inverted bit line NBIT0 to the uninverted bus line BUS and the inverted bus line NBUS, respectively.

Column n also includes a precharge circuit 211, first and second voltage transfer switches 223 and 224, first and second voltage input/output circuits 233 and 234, and a column switch 242. Signal CAn is a column selection signal of column n.

The semiconductor integrated circuit of FIG. 4 further includes a sense amplifier 250 and an output buffer 260. The sense amplifier 250 is a differential amplification circuit shared among a plurality of columns. When sense amplifier enable signal SAE is at H-level, the sense amplifier 250 drives the higher one of the voltages of the complementary bus line pair BUS and NBUS to supply voltage VDD and drives the lower one to ground voltage VSS, thereby amplifying the potential difference between the complementary bus line pair BUS and NBUS. The output buffer 260 outputs as data output signal DOUT the voltage of the uninvested bus line BUS which has been amplified by the sense amplifier 250.

Figure 5:
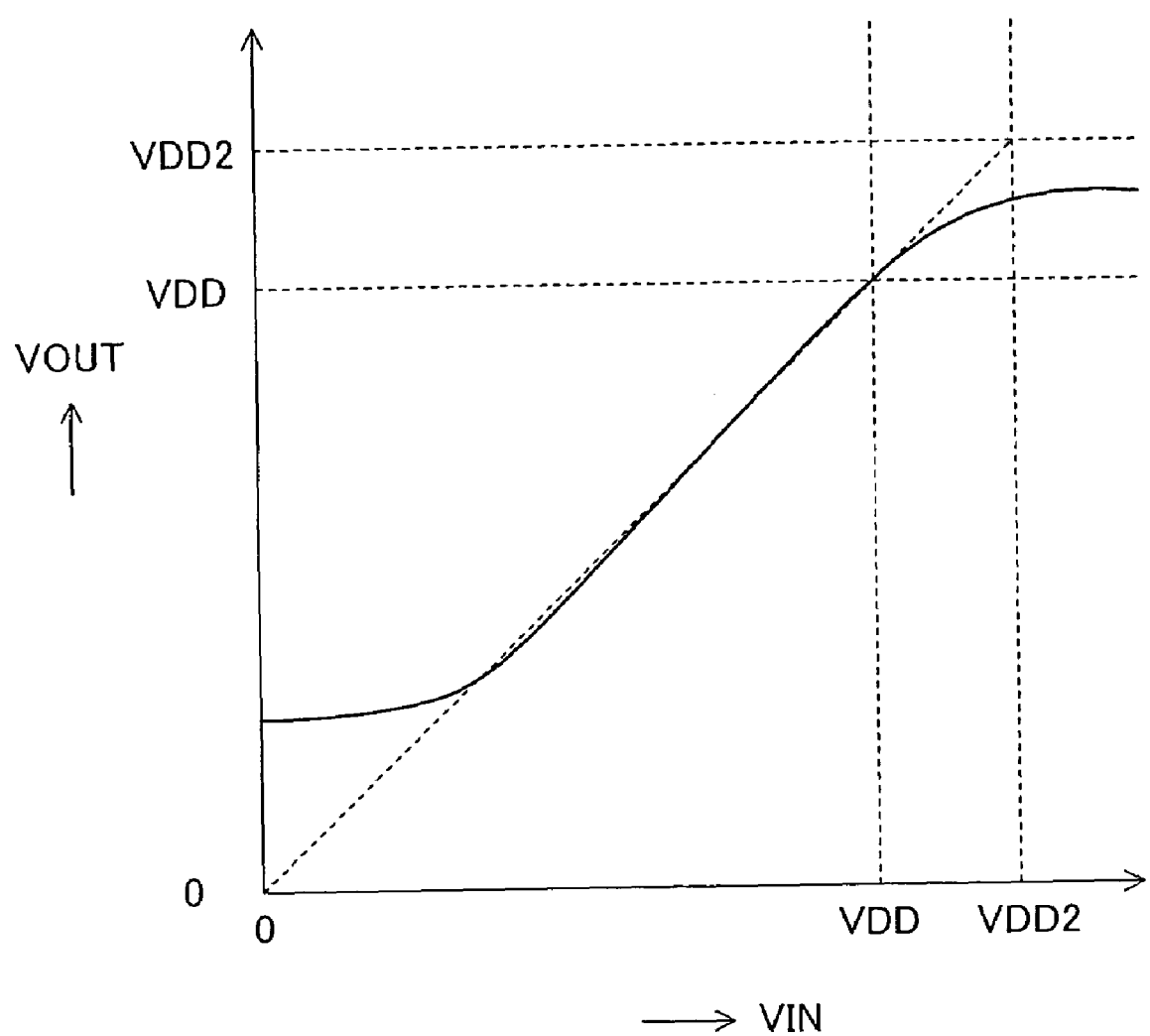
FIG. 5 shows the input/output characteristic of a voltage input/output circuit of FIG. 4.

FIG. 5 shows the input/output characteristic of the voltage input/output circuits 231 to 234 of FIG. 4. As illustrated by a solid line in FIG. 5, the input/output characteristic is linear when input voltage VIN is slightly lower than supply voltage VDD.

Figure 6:
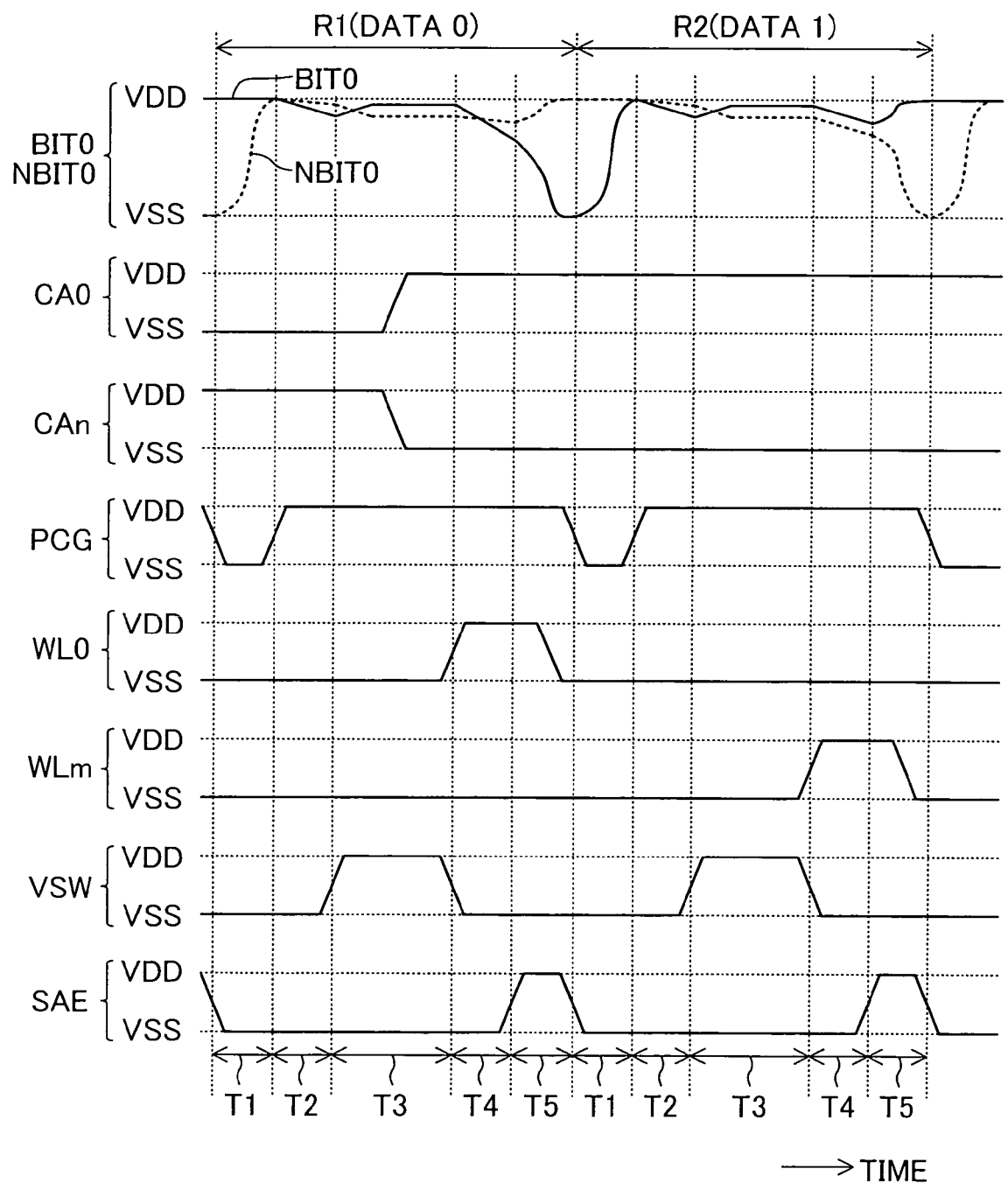
FIG. 6 is a timing chart showing exemplary signal waveforms in the semiconductor integrated circuit of FIG. 4.

FIG. 6 shows exemplary signal waveforms in the semiconductor integrated circuit of FIG. 4. In FIG. 6, R1 is the first read cycle, and R2 is the second read cycle. It is assumed herein that, in first read cycle R1, data of "0" is output from the first memory cell 201, and in second read cycle R2, data of "1" is output from the second memory cell 202. It is also assumed that, in all the memory cells 201 and 202 belonging to column 0, the off-leak currents of the first N-channel MOS access transistors 5 which are closer to the uninverted bit line BIT0 is larger than the off-leak currents of the second N-channel MOS access transistors 6 which are closer to the inverted bit line NBIT0.

In the first place, first read cycle R1 is described. Periods T1 to T3 are preparation periods, and periods T4 and T5 are actual read periods.

In period T1, precharge signal PCG is lowered to L-level while the word lines WL0 and WLm of all the memory cells 201 and 202 belonging to column 0 are kept at L-level, and switch control signal VSW is kept at L-level. In the meantime, the precharge circuit 210 precharges both the uninverted bit line BIT0, which has been charged to supply voltage VDD, and the inverted bit line NBIT0, which has been discharged to ground voltage VSS, to supply voltage VDD.

In period T2, precharge signal PCG is restored to H-level, whereby the operation of the precharge circuit 210 is stopped. After the precharge is stopped, the voltage of the uninverted bit line BIT0 gradually decreases because of the off-leak currents of the first N-channel MOS access transistors 5 in all the memory cells 201 and 202 belonging to column 0. The voltage of the inverted bit line NBIT0 also gradually decreases because of the off-leak currents of the second N-channel MOS access transistors 6 in all the memory cells 201 and 202 belonging to column 0. Since it is assumed herein that the off-leak currents of the first N-channel MOS access transistors 5 are larger than those of the second N-channel MOS access transistors 6, the voltage decrease is larger in the uninverted bit line BIT0 than in the inverted bit line NBIT0. In the meantime, the first voltage transfer switch 221 continues to supply the voltage of the uninverted bit line BIT0 to the first voltage input/output circuit 231 as an input voltage. The second voltage transfer switch 222 continues to supply the voltage of the inverted bit line NBIT0 to the second voltage input/output circuit 232 as an input voltage.

In period T3, switch control signal VSW is pulled up to H-level. In response to this, the first voltage transfer switch 221 supplies the output voltage of the second voltage input/output circuit 232 to the uninverted bit line BIT0, and the second voltage transfer switch 222 supplies the output voltage of the first voltage input/output circuit 231 to the inverted bit line NBIT0. As a result, the relationship between the voltages of the complementary bit line pair BIT0 and NBIT0 at the end of period T2 is inverted before the end of period T3. That is, the voltage exchange occurs between the complementary bit line pair BIT0 and NBIT0. In period T3, in order to select column 0 which includes the first memory cell 201 that is to be read in this cycle, column selection signal CA0 of column 0 is pulled up to H-level, whereas column selection signals CAn of all the other columns are at L-level. As a result, only the complementary bit line pair BIT0 and NBIT0 of column 0 is connected to the complementary bus line pair BUS and NBUS.

In period T4, switch control signal VSW is restored to L-level, whereby the first and second voltage transfer switches 221 and 222 are switched to the input side of the first and second voltage input/output circuits 231 and 232. As a result, driving of the complementary bit line pair BIT0 and NBIT0 by the first and second voltage input/output circuits 231 and 232 is halted. At the same time, the word line WL0 of row 0 is pulled to H-level, such that the first memory cell 201 performs an active output operation according to cell data "0". That is, the first N-channel MOS drive transistor 2 of the first memory cell 201 drives the uninverted bit line BIT0 toward L-level through the first N-channel MOS access transistor 5. Thus, the voltage of the uninverted bit line BIT0 decreases. On this occasion, the off-leak currents of the first N-channel MOS access transistors 5 of all the memory cells belonging to column 0, including the second memory cell 202, help a rapid decrease of voltage of the uninverted bit line BIT0. Thus, at the end of period T4, the voltage of the uninverted bit line BIT0 is lower than the voltage of the inverted bit line NBIT0, and the potential difference between the complementary bit line pair BIT0 and NBIT0 (i.e., the potential difference between the complementary bus line pair BUS and NBUS) exceeds a difference necessary for the operation of the sense amplifier 250.

In period T5, sense amplifier enable signal SAE is pulled to H-level, whereby the sense amplifier 250 is activated. As a result, the voltages of the uninverted bit line BIT0 and the uninverted bus line BUS are amplified to ground voltage VSS, and the voltages of the inverted bit line NBIT0 and the inverted bus line NBUS are amplified to supply voltage VDD. The voltage of the uninverted bus line BUS which is obtained in period T5 is output as data output signal DOUT (=0) through the output buffer 260.

The operation during periods T1 to T3 of second read cycle R2 is the same as that of first read cycle R1. At the end of period T3, the voltage of the inverted bit line NBIT0 is lower than the voltage of the uninverted bit line BIT0.

In period T4 of second read cycle R2, the word line WLm of row m is pulled to H-level, such that the second memory cell 202 performs an active output operation according to cell data "1". That is, the second N-channel MOS drive transistor 4 of the second memory cell 202 drives the inverted bit line NBIT0 toward L-level through the second N-channel MOS access transistor 6. Thus, the voltage of the inverted bit line NBIT0 decreases. In the meantime, the voltage of the uninverted bit line BIT0 also decreases due to the off-leak currents of the first N-channel MOS access transistors 5 in all the memory cells 201 and 202 belonging to column 0. However, even if the total sum of the off-leak currents of the first N-channel MOS access transistors 5 in all the memory cells 201 and 202 belonging to column 0 is almost as large as the ON-current (drive current) of the second N-channel MOS drive transistor 4 in the second memory cell 202, occurrence of a predetermined potential difference between the complementary bit line pair BIT0 and NBIT0 at the start of next period T5 is ensured because the voltage of the inverted bit line NBIT0 has been lowered in advance in period T3.

In next period T5, sense amplifier enable signal SAE is pulled to H-level, whereby the sense amplifier 250 is activated. As a result, the voltages of the uninverted bit line BIT0 and the uninverted bus line BUS are amplified to supply voltage VDD, and the voltages of the inverted bit line NBIT0 and the inverted bus line NBUS are amplified to ground voltage VSS. The voltage of the uninverted bus line BUS which is obtained in period T5 is output as data output signal DOUT (=1) through the output buffer 260.

The length of time from the falling of switch control signal VSW to activation of the sense amplifier 250 (period T4) is preferably set to equal the length of time in which a variation in voltages of the complementary bit line pair BIT0 and NBIT0 due to the off-leak currents before the voltage exchange between the complementary bit line pair BIT0 and NBIT0 is allowed (period T2).

Figure 7:
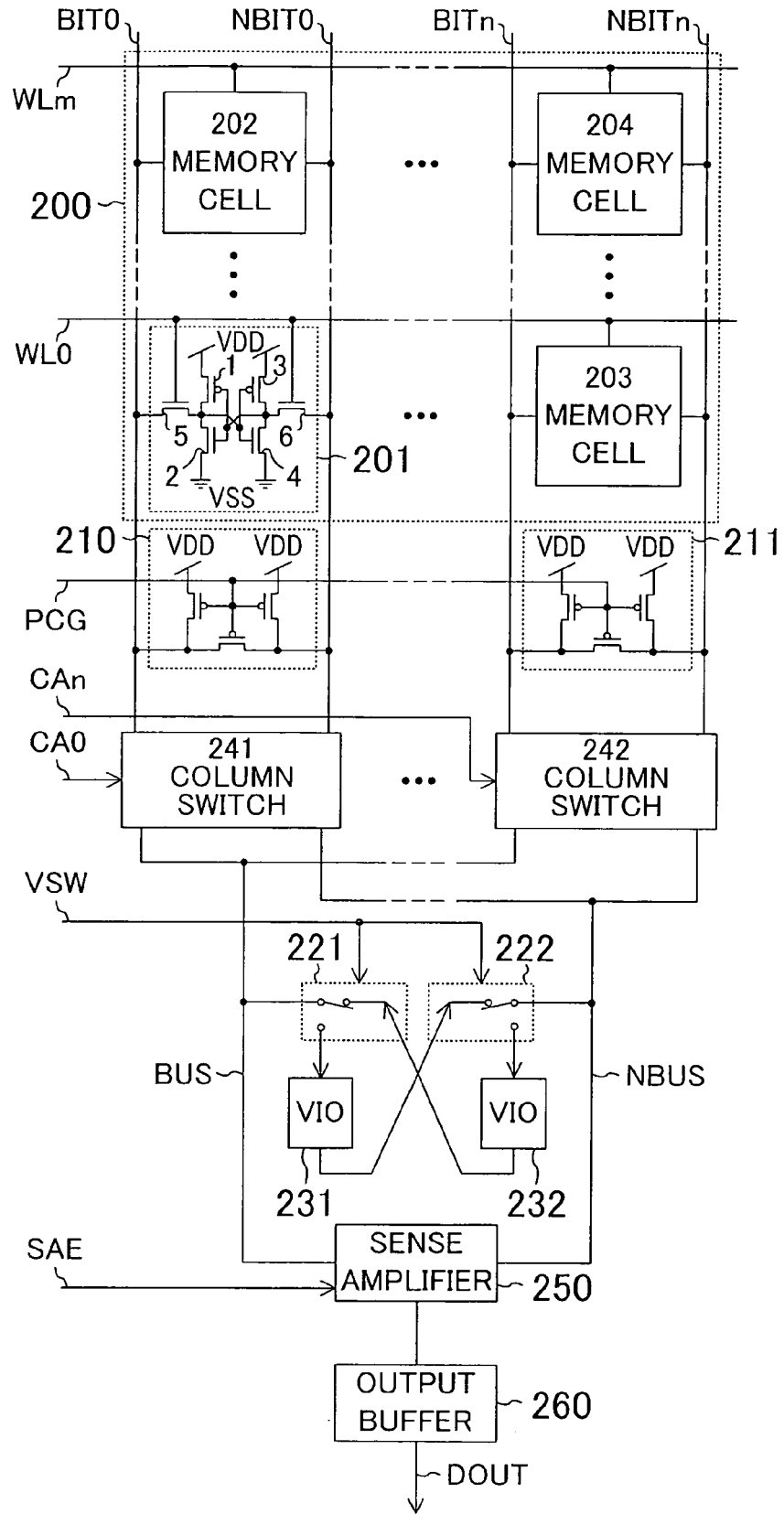
FIG. 7 is a circuit diagram showing a variation of the semiconductor integrated circuit of FIG. 4.

FIG. 7 shows a variation of the semiconductor integrated circuit of FIG. 4. In the semiconductor integrated circuit of FIG. 7, the first and second voltage transfer switches 221 and 222 and the first and second voltage input/output circuits 231 and 232 are provided on the complementary bus line pair BUS and NBUS so as to be shared among a plurality of columns of the SRAM memory cell array 200. As seen from FIG. 7, the chip area of the semiconductor integrated circuit is reduced as compared with the circuit of FIG. 4 where two voltage transfer switches and two voltage input/output circuits are separately provided to each column.

Figure 8:
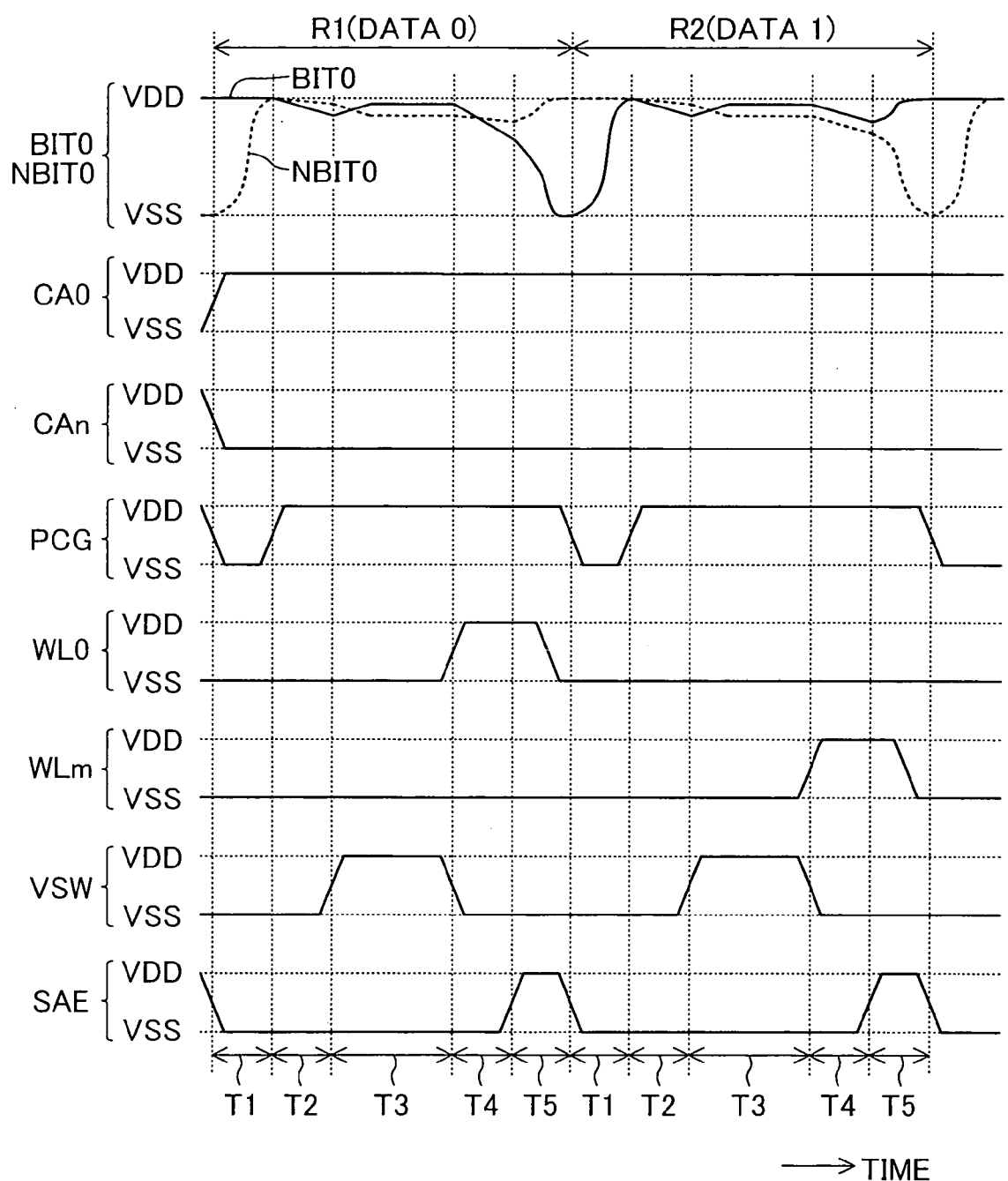
FIG. 8 is a timing chart showing exemplary signal waveforms in the semiconductor integrated circuit of FIG. 7.

FIG. 8 shows exemplary signal waveforms in the semiconductor integrated circuit of FIG. 7. The example of FIG. 8 is different from the example of FIG. 6 in that all of the column selection signals CA0 and CAn are determined at an earlier time in the first period (period T1) of first read cycle R1.

Figure 9:
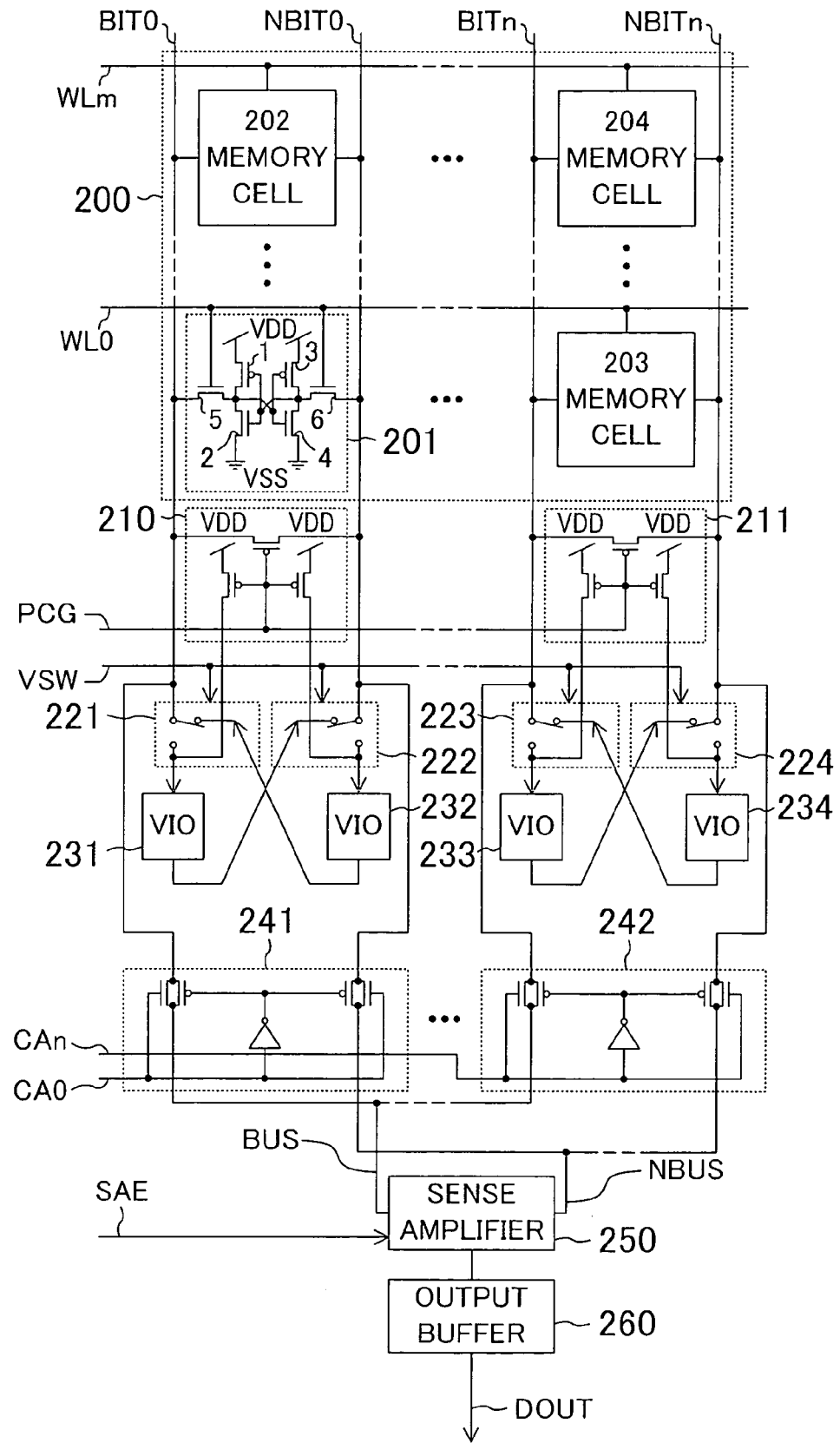
FIG. 9 is a circuit diagram showing another variation of the semiconductor integrated circuit of FIG. 4.

FIG. 9 shows another variation of the semiconductor integrated circuit of FIG. 4. In the semiconductor integrated circuit of FIG. 9, the precharge circuit 210 precharges the complementary bit line pair BIT0 and NBIT0 to supply voltage VDD through the first and second voltage input/output circuits 231 and 232. With such a structure, the size of the transistors which constitute the precharge circuit 210 is reduced as compared with the structure of FIG. 4 where the precharge circuit 210 directly precharges the complementary bit line pair BIT0 and NBIT0. This also applies to the precharge circuit 211 of column n.

Figure 10:
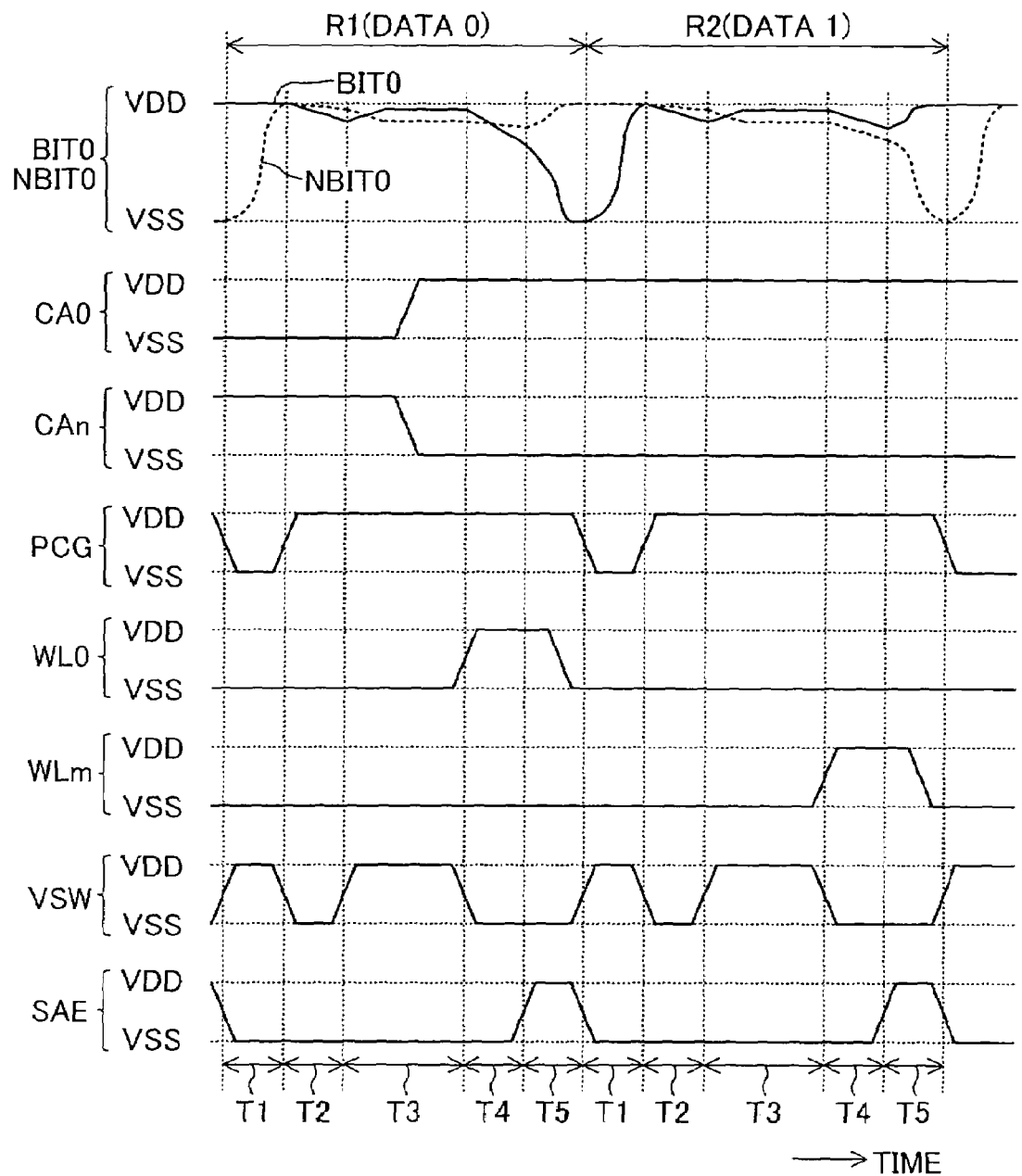
FIG. 10 is a timing chart showing exemplary signal waveforms in the semiconductor integrated circuit of FIG. 9.

FIG. 10 shows exemplary signal waveforms in the semiconductor integrated circuit of FIG. 9. The example of FIG. 10 is different from the example of FIG. 6 in that even when precharge signal PCG is lowered to L-level such that the complementary bit line pair BIT0 and NBIT0 is precharged, switch control signal VSW is pulled to H-level such that the first and second voltage transfer switches 221 and 222 are switched to the output side of the first and second voltage input/output circuits 231 and 232.

Figure 11:
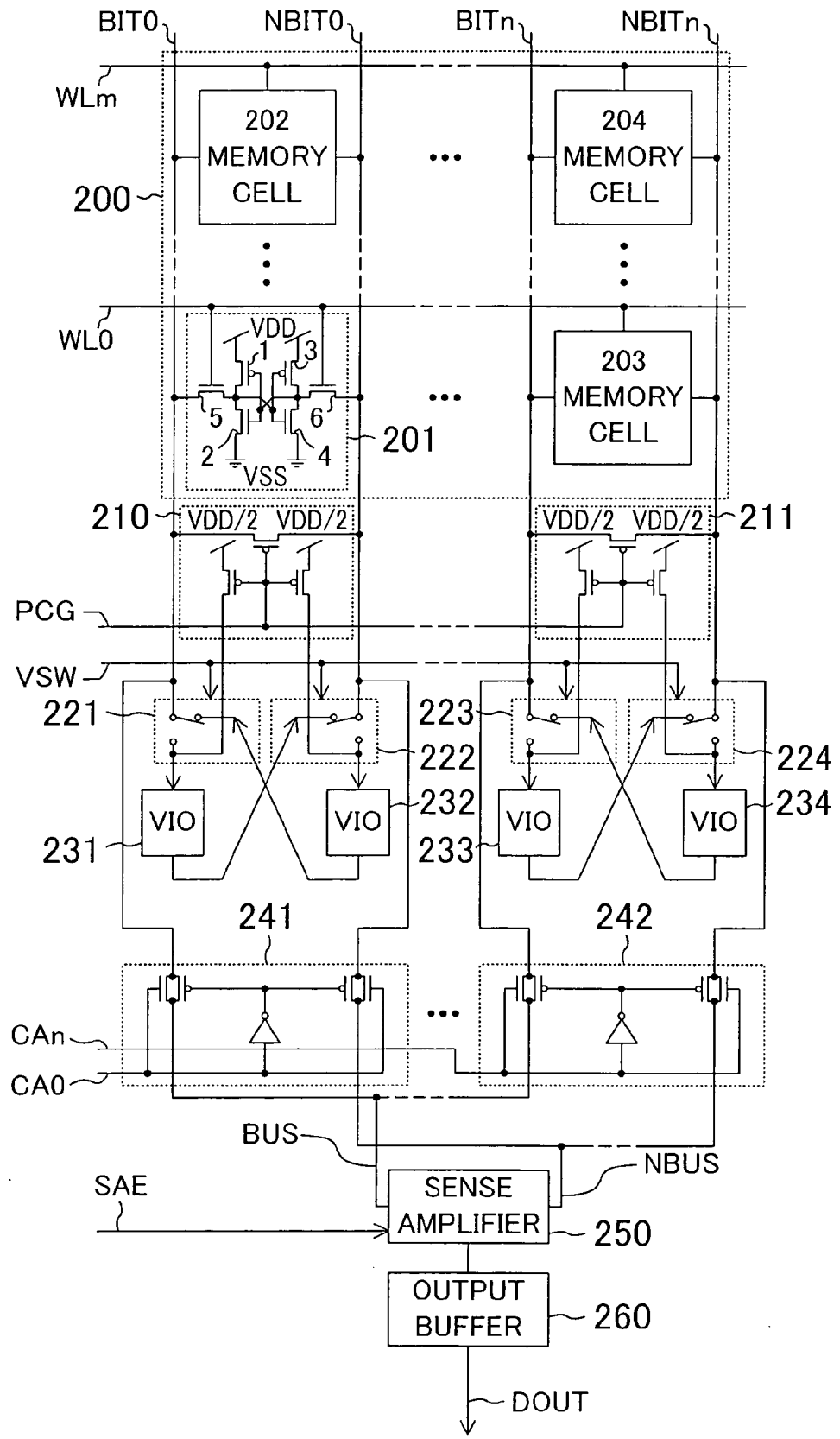
FIG. 11 is a circuit diagram showing still another variation of the semiconductor integrated circuit of FIG. 4.

FIG. 11 shows still another variation of the semiconductor integrated circuit of FIG. 4. In the semiconductor integrated circuit of FIG. 11, the precharge circuit 210 precharges the complementary bit line pair BIT0 and NBIT0 to intermediate level voltage VDD/2 through the first and second voltage input/output circuits 231 and 232. With such a structure, in the first and second voltage input/output circuits 231 and 232 of FIG. 11, the supply voltage is VDD as in the voltage input/output circuit 150 of FIG. 1, and the respective input/output characteristics are set as shown in FIG. 2. Thus, it is not necessary to provide a circuit for increasing VDD to VDD2, and therefore, the chip area of the semiconductor integrated circuit is reduced as compared with the examples of FIGS. 4 and 7. This also applies to the precharge circuit 211 and the first and second voltage input/output circuits 233 and 234 of column n.

Figure 12:
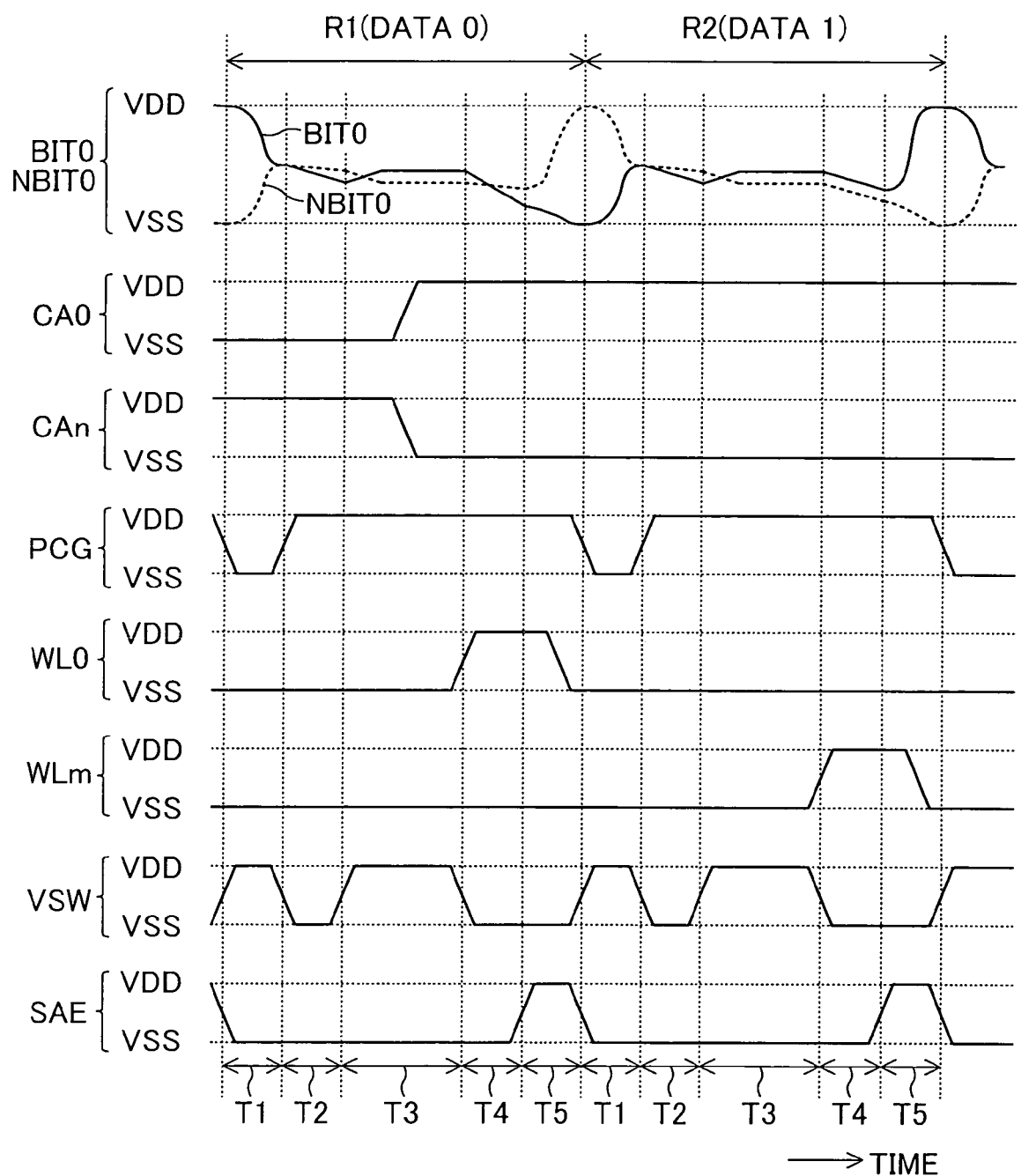
FIG. 12 is a timing chart showing exemplary signal waveforms in the semiconductor integrated circuit of FIG. 11.

FIG. 12 shows exemplary signal waveforms in the semiconductor integrated circuit of FIG. 11. The example of FIG. 12 is different from the example of FIG. 10 in that the precharge voltage of the complementary bit line pair BIT0 and NBIT0 is intermediate level voltage VDD/2. In the structure of FIG. 11, a gate-leak reduction effect is attained in the memory cells 201 to 204 by reduction of the precharge voltage.

Figure 13:
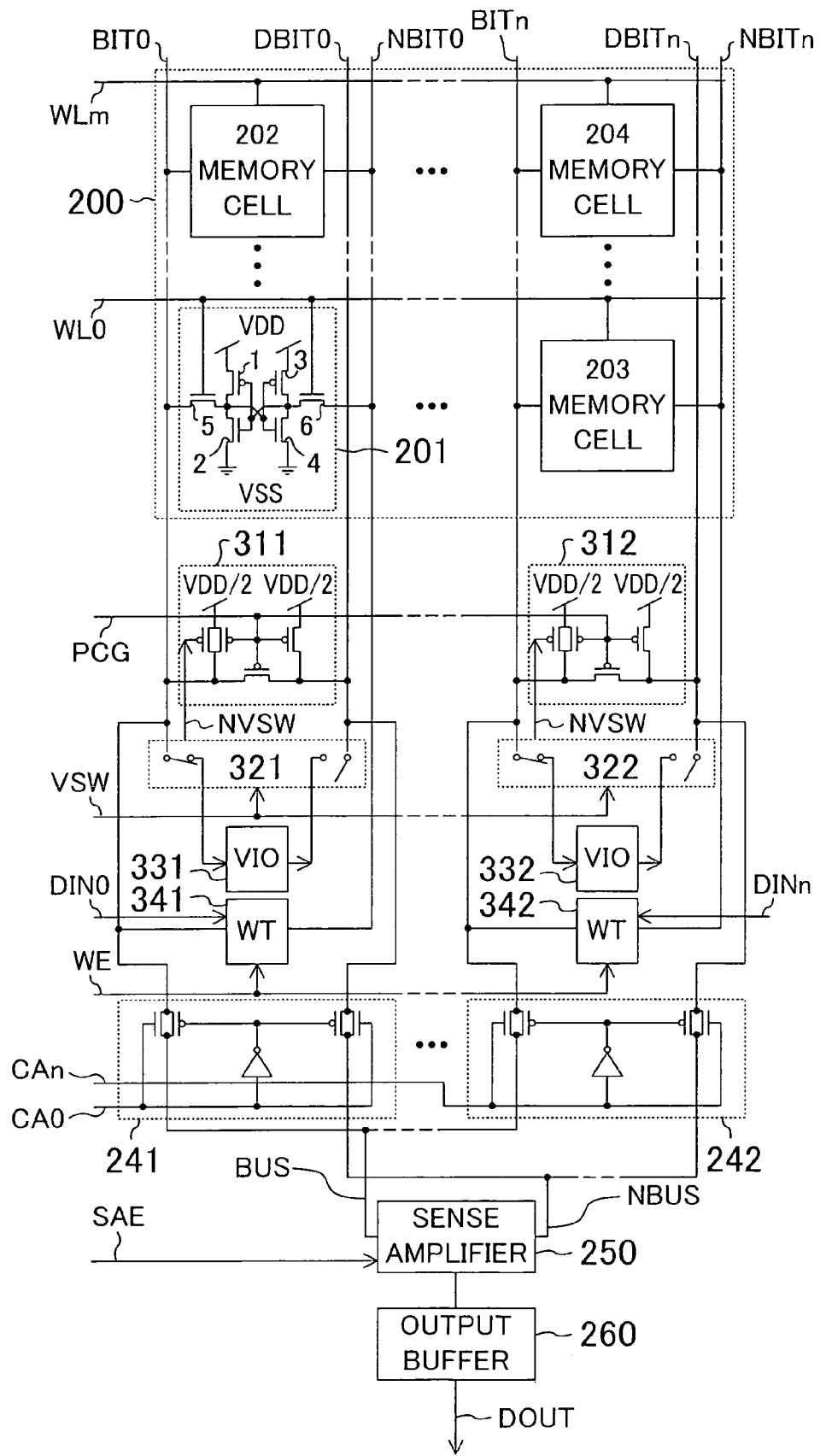
FIG. 13 is a circuit diagram showing a structure of a semiconductor integrated circuit according to the third embodiment of the present invention.

FIG. 13 shows a structure of a semiconductor integrated circuit according to the third embodiment of the present invention. The semiconductor integrated circuit of FIG. 13 is realized by applying the precharge voltage adjustment method of the first embodiment to the semiconductor memory of the second embodiment. The memory cells 201 to 204, the sense amplifier 250 and the output buffer 260 of FIG. 13 are equivalent to the corresponding circuit blocks of FIG. 4.

In the SRAM memory cell array 200 of FIG. 13, column 0 includes a dummy bit line DBIT0 in addition to the complementary bit line pair BIT0 and NBIT0. The dummy bit line DBIT0 has a line capacitance substantially equal to that of the uninverted bit line BIT0. It should be noted that none of the memory cells is connected to the dummy bit line DBIT0. Signal line DBITn is a dummy bit line of column n.

Referring to FIG. 13, a precharge circuit 311, a voltage transfer switch 321, a voltage input/output circuit (VIO) 331, a write circuit (WT) 341 and a column switch 241 belong to column 0.

When precharge signal PCG is at L-level, the precharge circuit 311 precharges the uninverted bit line BIT0 and the dummy bit line DBIT0 to intermediate level voltage VDD/2. When inverted switch control signal NVSW (inverted signal of switch control signal VSW) is at L-level, i.e., when switch control signal VSW is at H-level, the precharge circuit 311 precharges only the uninverted bit line BIT0 to intermediate level voltage VDD/2.

The voltage input/output circuit 331 has the same functions and circuit structure as those of the voltage input/output circuit 150 of FIG. 1.

The voltage transfer switch 321 has the same circuit structure as that of the voltage transfer switch 160 of FIG. 1. When switch control signal VSW is at L-level, the voltage transfer switch 321 supplies the voltage of the uninverted bit line BIT0 to the voltage input/output circuit 331 as an input voltage. Thereafter, when switch control signal VSW rises to H-level, the output voltage of the voltage input/output circuit 331 is supplied to the dummy bit line DBIT0.

When write enable signal WE is activated, the write circuit 341 supplies a voltage signal determined according to the write data to the complementary bit line pair BIT0 and NBIT0 in response to write signal DIN0 of column 0.

When column selection signal CA0 of column 0 is at H-level, the column switch 241 connects the uninverted bit line BIT0 and the dummy bit line DBIT0 to the uninverted bus line BUS and the inverted bus line NBUS, respectively.

Column n also includes a precharge circuit 312, a voltage transfer switch 322, a voltage input/output circuit 332, a write circuit 342 and a column switch 242. Signal DINn is a write signal of column n, and signal CAn is a column selection signal of column n.

Figure 14:
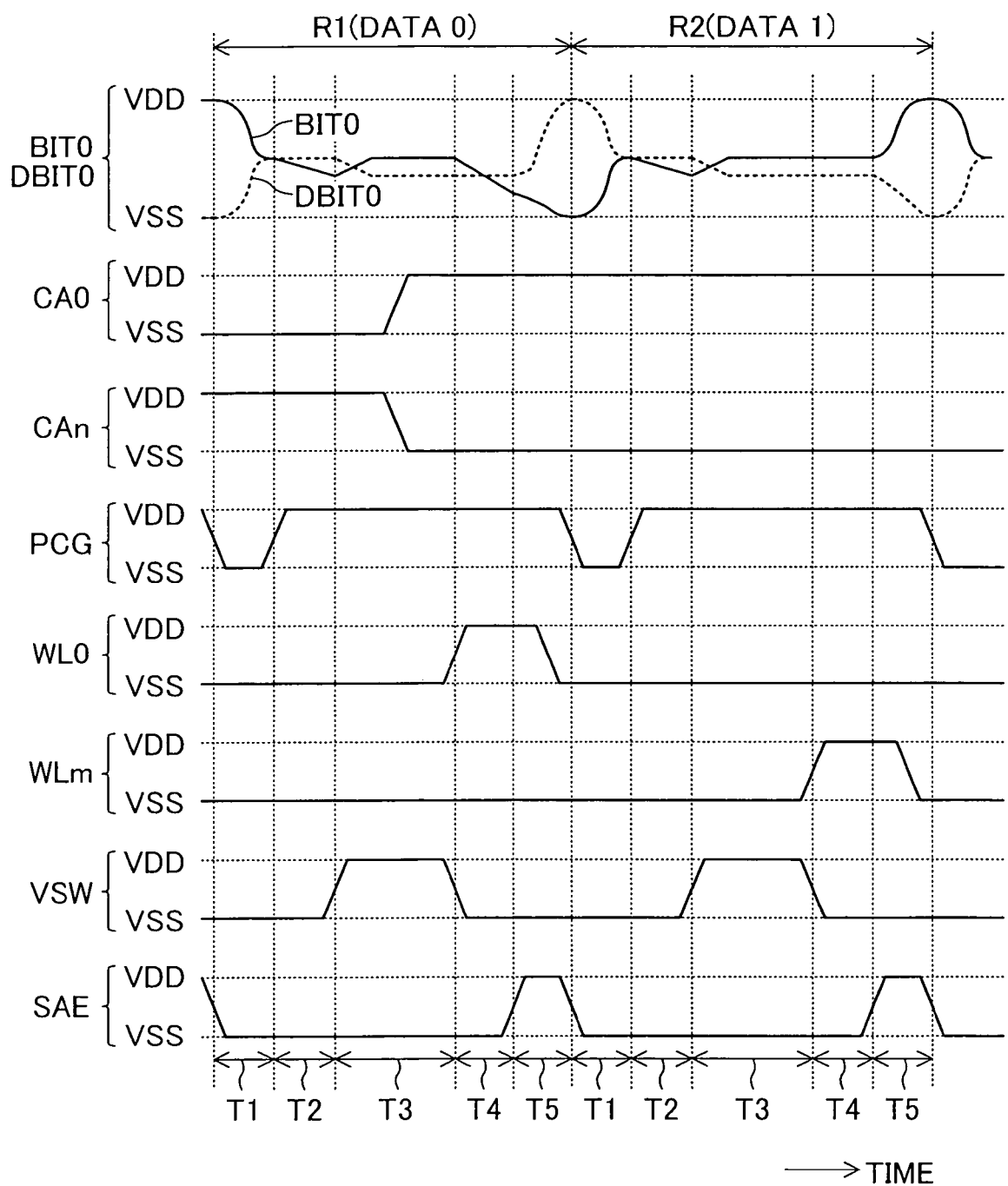
FIG. 14 is a timing chart showing exemplary signal waveforms in the semiconductor integrated circuit of FIG. 13.

FIG. 14 shows exemplary signal waveforms in the semiconductor integrated circuit of FIG. 13. In FIG. 14, R1 is the first read cycle, and R2 is the second read cycle. It is assumed herein that, in first read cycle R1, data of "0" is read out from the first memory cell 201, and in second read cycle R2, data of "1" is read out from the second memory cell 202.

In the first place, first read cycle R1 is described. Periods T1 to T3 are preparation periods, and periods T4 and T5 are actual read periods.

In period T1, precharge signal PCG is lowered to L-level while the word lines WL0 and WLm of all the memory cells 201 and 202 belonging to column 0 are kept at L-level, and switch control signal VSW is kept at L-level. In the meantime, the precharge circuit 311 precharges both the uninverted bit line BIT0, which has been charged to supply voltage VDD, and the dummy bit line DBIT0, which has been discharged to ground voltage VSS, to intermediate level voltage VDD/2.

In period T2, precharge signal PCG is restored to H-level, whereby the operation of the precharge circuit 311 is stopped. After the precharge is stopped, the voltage of the uninverted bit line BIT0 gradually decreases because of the off-leak currents of the first N-channel MOS access transistors 5 in all the memory cells 201 and 202 belonging to column 0. In the meantime, the voltage transfer switch 321 continues to supply the voltage of the uninverted bit line BIT0 to the voltage input/output circuit 331 as an input voltage. On the other hand, the voltage of the dummy bit line DBIT0 scarcely changes.

In period T3, switch control signal VSW is pulled up to H-level. In response to this, the voltage transfer switch 321 is switched from the input side to output side of the voltage input/output circuit 331, such that the output voltage of the voltage input/output circuit 331 is supplied to the dummy bit line DBIT0. In the meantime, the precharge circuit 311 receives inverted switch control signal NVSW from the voltage transfer switch 321 to again precharge only the former of the uninverted bit line BIT0 and the dummy bit line DBIT0 to intermediate level voltage VDD/2. As a result, the relationship between the voltage of the uninverted bit line BIT0 and the voltage of the dummy bit line DBIT0 at the end of period T2 is inverted before the end of period T3. That is, the precharge voltage of the dummy bit line DBIT0 is adjusted to a voltage in which the total sum of the off-leak currents of the first N-channel MOS access transistors 5 in all the memory cells 201 and 202 belonging to column 0 which are in a high impedance output state is reflected. In period T3, in order to select column 0 which includes the first memory cell 201 that is to be read in this cycle, column selection signal CA0 of column 0 is pulled up to H-level, whereas the column selection signals CAn of all the other columns are at L-level. As a result, only the uninverted bit line BIT0 and the dummy bit line DBIT0 of column 0 are connected to the complementary bus line pair BUS and NBUS.

In period T4, switch control signal VSW is restored to L-level, whereby the voltage transfer switch 321 is switched to the input side of the voltage input/output circuit 331, and the operation of the precharge circuit 311 is stopped. As a result, driving of the dummy bit line DBIT0 by the voltage input/output circuit 331 is halted. At the same time, the word line WL0 of row 0 is pulled to H-level, such that the first memory cell 201 performs an active output operation according to cell data "0". That is, the first N-channel MOS drive transistor 2 of the first memory cell 201 drives the uninverted bit line BIT0 toward L-level through the first N-channel MOS access transistor 5. Thus, the voltage of the uninvested bit line BIT0 decreases. On this occasion, the off-leak currents of the first N-channel MOS access transistors 5 of all the memory cells belonging to column 0, including the second memory cell 202, help a rapid decrease of voltage of the uninvested bit line BIT0. Thus, at the end of period T4, the voltage of the uninverted bit line BIT0 is lower than the voltage of the dummy bit line DBIT0, and the potential difference between the uninverted bit line BIT0 and the dummy bit line DBIT0 (i.e., the potential difference between the complementary bus line pair BUS and NBUS) exceeds a difference necessary for the operation of the sense amplifier 250.

In period T5, sense amplifier enable signal SAE is pulled to H-level, whereby the sense amplifier 250 is activated. As a result, the voltages of the uninverted bit line BIT0 and the uninverted bus line BUS are amplified to ground voltage VSS, and the voltages of the dummy bit line DBIT0 and the inverted bus line NBUS are amplified to supply voltage VDD. The voltage of the uninverted bus line BUS which is obtained in period T5 is output as data output signal DOUT (=0) through the output buffer 260.

The operation during periods T1 to T3 of second read cycle R2 is the same as that of first read cycle R1. At the end of period T3, the voltage of the dummy bit line DBIT0 is lower than the voltage of the uninverted bit line BIT0.

In period T4 of second read cycle R2, the word line WLm of row m is pulled to H-level, such that the second memory cell 202 performs an active output operation according to cell data "1". That is, the second N-channel MOS drive transistor 4 of the second memory cell 202 drives the inverted bit line NBIT0 toward L-level through the second N-channel MOS access transistor 6. The first P-channel MOS load transistor 1 of the second memory cell 202 pulls up the uninverted bit line BIT0 toward H-level through the first N-channel MOS access transistor 5. However, the voltage of the dummy bit line DBIT0 scarcely changes. On the other hand, the voltage of the uninverted bit line BIT0 decreases due to the off-leak currents of the first N-channel MOS access transistors 5 in all the memory cells 201 and 202 belonging to column 0. However, even if the total sum of the off-leak currents of the first N-channel MOS access transistors 5 in all the memory cells 201 and 202 belonging to column 0 is almost as large as the ON-current (drive current) of the second N-channel MOS drive transistor 4 in the second memory cell 202, occurrence of a predetermined potential difference between the uninverted bit line BIT0 and the dummy bit line DBIT0 at the start of next period T5 is ensured because the voltage of the dummy bit line DBIT0 has been lowered in advance in period T3.

In next period T5, sense amplifier enable signal SAE is pulled to H-level, whereby the sense amplifier 250 is activated. As a result, the voltages of the uninverted bit line BIT0 and the uninverted bus line BUS are amplified to supply voltage VDD, and the voltages of the dummy bit line DBIT0 and the inverted bus line NBUS are amplified to ground voltage VSS. The voltage of the uninverted bus line BUS which is obtained in period T5 is output as data output signal DOUT (=1) through the output buffer 260.

The length of time from a halt of re-precharging by pulling down switch control signal VSW to activation of the sense amplifier 250 (period T4) is preferably set to equal the length of time in which a variation in voltage of the uninverted bit line BIT0 due to the off-leak currents of the first N-channel MOS access transistors 5 in all the memory cells 201 and 202 belonging to column 0 before the voltage adjustment of the dummy bit line DBIT0 is allowed (period T2).

As described above, a semiconductor integrated circuit of the present invention is useful because the influence of off-leak currents of transistors can be alleviated without causing an increase in power consumption.

What is claimed is:

1. A semiconductor integrated circuit, comprising:
    first and second signal lines;
    a plurality of transistors, each of which has a drain connected to the first signal line;
    a precharge circuit for precharging the first and second signal lines to a first voltage;
    voltage adjustment means for adjusting, when the voltage of the first signal line changes to a second voltage due to off-leak currents of the plurality of transistors after completion of the precharge, the voltage of the second signal line to the second voltage before an actual operation of any of the plurality of transistors; and
    a differential amplification circuit for amplifying a potential difference between the first and second signal lines at the time of an actual operation of any of the plurality of transistors.

2. The semiconductor integrated circuit of claim 1, wherein:
    the plurality of transistors are P-channel MOS drive transistors and N-channel MOS drive transistors which are included in a plurality of tri-state buffers;
    the second signal line is a dummy line which has a line capacitance substantially equal to that of the first signal line; and
    when outputs of the plurality of tri-state buffers are all in a high impedance state, the voltage adjustment means performs voltage adjustment of the second signal line.

3. The semiconductor integrated circuit of claim 2, wherein the precharge circuit precharges the first and second signal lines to an intermediate level voltage which is lower than a supply voltage and higher than a ground voltage.

4. The semiconductor integrated circuit of claim 2, wherein after the voltage adjustment of the second signal line, the precharge circuit again precharges only the first signal line to the first voltage before any of the plurality of tri-state buffers is selected.

5. The semiconductor integrated circuit of claim 4, wherein the length of time from a halt of the again-precharge to activation of the differential amplification circuit is set to equal the length of time in which a variation in voltage of the first signal line due to the off-leak currents before the voltage adjustment of the second signal line is allowed.

6. The semiconductor integrated circuit of claim 2, wherein the voltage adjustment means includes:
    a voltage input/output circuit which has a function of taking in an input voltage to output a voltage equal to the input voltage; and
    a voltage transfer switch for supplying as an input voltage the second voltage to the voltage input/output circuit at the time when the voltage of the first signal line is changed to the second voltage and, thereafter, supplying a voltage output from the voltage input/output circuit to the second signal line before any of the plurality of tri-state buffers is selected.

7. The semiconductor integrated circuit of claim 1, wherein:
    the plurality of transistors are MOS access transistors which are included in a plurality of memory cells;
    the first and second signal lines constitute a complementary bit line pair connected to the plurality of memory cells; and
    when the plurality of memory cells are all in an unselected state, the voltage adjustment means performs voltage exchange between the first and second signal lines.

8. The semiconductor integrated circuit of claim 7, wherein the precharge circuit precharges the first and second signal lines to a voltage equal to a supply voltage of the plurality of memory cells.

9. The semiconductor integrated circuit of claim 7, wherein the precharge circuit precharges the first and second signal lines to an intermediate level voltage which is lower than the supply voltage of the plurality of memory cells and higher than a ground voltage.

10. The semiconductor integrated circuit of claim 7, wherein the voltage adjustment means includes:
    first and second voltage input/output circuits, each of which has a function of taking in an input voltage to output a voltage equal to the input voltage; and
    a first voltage transfer switch for supplying as an input voltage the voltage of the first signal line to the first voltage input/output circuit and, thereafter, supplying the voltage output from the second voltage input/output circuit to the first signal line before any of the plurality of memory cells is selected; and
    a second voltage transfer switch for supplying as an input voltage the voltage of the second signal line to the second voltage input/output circuit and, thereafter, supplying the voltage output from the first voltage input/output circuit to the second signal line before any of the plurality of memory cells is selected.

11. The semiconductor integrated circuit of claim 10, wherein the length of time from a halt of driving of the first and second signal lines by the first and second voltage input/output circuits to activation of the differential amplification circuit is set to equal the length of time in which a variation in voltage of the first and second signal lines due to the off-leak currents before the voltage exchange between the first and second signal lines is allowed.

12. The semiconductor integrated circuit of claim 10, wherein:
the plurality of memory cells belong to one column of a memory cell array; and
the first and second voltage input/output circuits and the first and second voltage transfer switches are separately provided to each column of the memory cell array.

13. The semiconductor integrated circuit of claim 10, wherein:
the plurality of memory cells belong to one column of a memory cell array; and
the first and second voltage input/output circuits and the first and second voltage transfer switches are shared among a plurality of columns of the memory cell array.

14. The semiconductor integrated circuit of claim 10, wherein the precharge circuit precharges the first and second signal lines through the first and second voltage input/output circuits.

15. The semiconductor integrated circuit of claim 1, wherein:
the plurality of transistors are MOS access transistors which are included in a plurality of memory cells;
the first signal line is one bit line of a complementary bit line pair connected to the plurality of memory cells;
the second signal line is a dummy bit line which has a line capacitance substantially equal to that of the one bit line; and
when the plurality of memory cells are all in an unselected state, the voltage adjustment means performs voltage adjustment of the second signal line.

16. The semiconductor integrated circuit of claim 15, wherein the precharge circuit precharges the first and second signal lines to an intermediate level voltage which is lower than a supply voltage of the plurality of memory cells and higher than a ground voltage.

17. The semiconductor integrated circuit of claim 15, wherein after the voltage adjustment of the second signal line, the precharge circuit again precharges only the first signal line to the first voltage before any of the plurality of memory cells is selected.

18. The semiconductor integrated circuit of claim 17, wherein the length of time from a halt of the again-precharge to activation of the differential amplification circuit is set to equal the length of time in which a variation in voltage of the first signal line due to the off-leak currents before the voltage adjustment of the second signal line is allowed.

19. The semiconductor integrated circuit of claim 15, wherein the voltage adjustment means includes:
a voltage input/output circuit which has a function of taking in an input voltage to output a voltage equal to the input voltage; and
a voltage transfer switch for supplying as an input voltage the second voltage to the voltage input/output circuit at the time when the voltage of the first signal line is changed to the second voltage and, thereafter, supplying a voltage output from the voltage input/output circuit to the second signal line before any of the plurality of memory cells is selected.

20. The semiconductor integrated circuit of claim 19, wherein:
the plurality of memory cells belong to one column of a memory cell array; and
the voltage input/output circuit and the voltage transfer switch are separately provided to each column of the memory cell array.

* * * * *